United States Patent [19]
Ogino et al.

[11] Patent Number: 5,502,003
[45] Date of Patent: Mar. 26, 1996

[54] SILICON CARBIDE ELECTRONIC DEVICE MANUFACTURING METHOD

[75] Inventors: Shinji Ogino; Tatsuo Urushidani; Hiroshi Kanemaru, all of Kanagawa, Japan

[73] Assignee: Fuji Electric Co., Ltd., Japan

[21] Appl. No.: 396,147

[22] Filed: Mar. 1, 1995

[30] Foreign Application Priority Data

Mar. 4, 1994 [JP] Japan ................................. 6-033983

[51] Int. Cl.$^6$ ............................................... H01L 21/28
[52] U.S. Cl. ........................ 437/189; 437/192; 437/100; 437/177
[58] Field of Search ..................... 437/187, 188, 437/189, 190, 192, 196, 200, 100; 148/DIG. 148; 257/741, 77

[56] References Cited

U.S. PATENT DOCUMENTS

| | | | |
|---|---|---|---|
| 3,600,645 | 8/1971 | Berman | 437/188 |
| 4,735,913 | 4/1988 | Hayes | 437/177 |
| 4,738,937 | 4/1988 | Parsons | 437/187 |
| 4,923,823 | 5/1990 | Kohno | 437/177 |
| 5,045,497 | 9/1991 | Hayashi et al. | 437/177 |
| 5,155,559 | 10/1992 | Humphreys et al. | 437/177 |
| 5,264,713 | 11/1993 | Palmour | 437/100 |
| 5,270,252 | 12/1993 | Papanicolaou | 437/100 |
| 5,270,554 | 12/1993 | Palmour | 437/100 |
| 5,278,431 | 1/1994 | Das | 457/77 |
| 5,409,859 | 4/1995 | Glass et al. | 437/187 |
| 5,436,505 | 7/1995 | Hayashi et al. | 257/77 |

FOREIGN PATENT DOCUMENTS 61-67272  4/1986  Japan .................................. 437/177

*Primary Examiner*—George Fourson
*Assistant Examiner*—S. Mulpuri
*Attorney, Agent, or Firm*—Parkhurst, Wendel & Rossi

[57] ABSTRACT

Reciprocal diffusion is prevented in a SiC electronic device by interposing an intermediate layer composed of W or a W-Si alloy rather than forming the Ni electrode directly on a SiC base, providing a stable electrode for which the contact resistance does not increase even when high temperatures are maintained. Bonding is facilitated when Au layer is formed on top of the Ni layer.

6 Claims, 5 Drawing Sheets

SILICON CARBIDE ELECTRONIC DEVICE MANUFACTURING METHOD

FIELD OF THE INVENTION

The present invention relates to methods of manufacturing silicon carbide electronic devices having electrodes formed by administering heat treatment to metals deposited on a semiconductor base of silicon carbide (hereafter, SIC).

BACKGROUND OF THE INVENTION

Power devices using Si are currently being developed for high frequency, high power control, and there has been a growing trend to achieve higher performances through various structural contrivances, which are approaching theoretical limits. Power devices must often operate in adverse environments subject to high temperatures, radiation, etc., and such devices cannot be produced with Si. New materials are therefore necessary to attain higher performance. Because it has a broad forbidden bandwidth of 2.93 eV in 6H-type, SiC provides superior electrical conductivity control and radiation resistance at high temperatures; its dielectric breakdown field of one order of magnitude greater than that of Si enables its use in high-voltage devices; and because the saturation drift speed of the electrons are approximately twice that of Si, SiC can be used as a semiconductor material with high frequency, high power control.

When SiC, with its superior characteristics, is used in power devices, Ni is used for the ohmic contact electrodes on n-type SiC. However, using vacuum deposition methods to deposit Ni only on n-type SiC creates a Schottky barrier at the interface between the metal and the semiconductor, producing rectification characteristics and preventing ohmicity. Heat treatment accelerates diffusion of Ni throughout the SiC and, inversely, Si or C contained in SiC throughout the Ni, producing ohmic contact electrodes for the first time. One drawback is that it is necessary to administer heat treatment at temperatures above 1,000° C. to achieve diffusion. Other drawbacks are that during heat treatment, the Ni and Si from SiC diffuse into each other forming nickel silicide, and C contained in SiC diffuses to the surface of the Ni electrodes to precipitate as graphite, as described on page 567 of Mat. Res. Soc. Symp. Proc. Vol. 242 (1992), (J. B. Petit et al), or the Ni continues to diffuse into the SiC due to extended application of high temperature, thereby increasing contact resistance of the electrodes.

It is an object of the invention to eliminate these defects by providing a method of manufacturing SiC electronic devices that can prevent the reciprocal diffusion of Ni in the electrodes with the Si or C contained in the SiC.

SUMMARY OF THE INVENTION

In order to achieve the above objective, the manufacturing method of the present invention for SiC electronic devices is one in which the electrodes are formed through the medium of a W layer on an n-type SiC base by administering heat treatment after depositing the conductive metal layer (at least the side which contacts the W layer should be made of nickel). A heat treatment temperature of 1,100° C. or higher and 1,300° C. or lower is effective. A further manufacturing method of the present invention for SiC electronic devices is one in which the electrodes are formed through the medium of an W-Si alloy layer on an n-type SiC base by administering heat treatment after depositing the conductive metal layer (at least the side which contacts the W layer should be made of nickel). In such circumstances, the composition of W in the W-Si alloy is preferably 25 atomic % or greater and 67 atomic % or less. In addition, a heat treatment temperature of 800° C. or higher and 1,300° C. or lower is effective.

When a W layer or W-Si alloy layer is disposed between n-type SiC and a Ni layer, heat treatment will cause some of the W or W-Si alloy to react with C in the SiC, forming tungsten carbide. If the heat treatment continues, this tungsten carbide will prevent the diffusion of C, Si and Ni, and a thermally stable metal/semiconductor interface with no reciprocal diffusion results. If the heat treatment temperature does not exceed 1,100° C. when the intermediate layer is a W layer, the W and Si do not form an alloy, and when a W-Si alloy layer is used, the Ni and W-Si do not form an alloy at a temperature of under 800° C. In both cases, Ni evaporates when the temperature exceeds 1,300° C.

BRIEF DESCRIPTION OF THE DRAWINGS

The invention will be described with reference to certain preferred embodiments thereof in conjunction with the accompanying drawings, wherein.

DETAILED DESCRIPTION OF THE PREFERRED EMBODIMENTS

Figure 1:
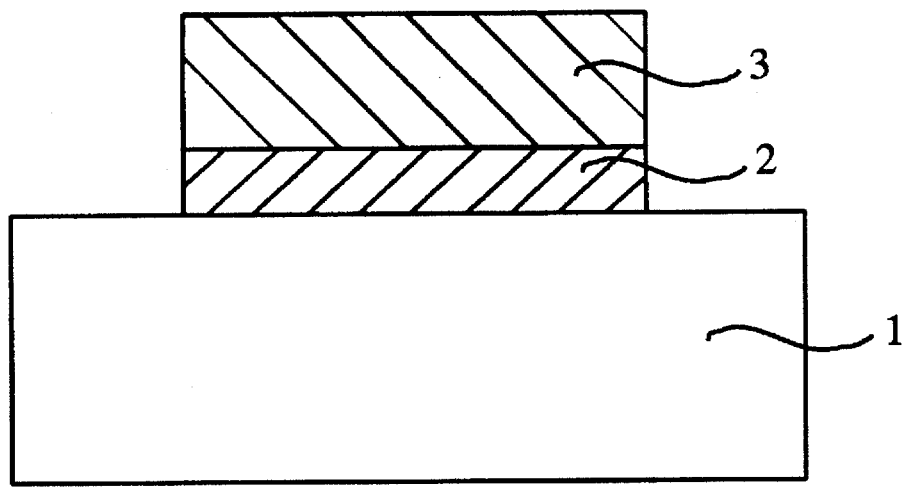
FIG. 1 is a cross-sectional view of the SiC electronic device electrode of the first embodiment of the present invention.
Figure 2:
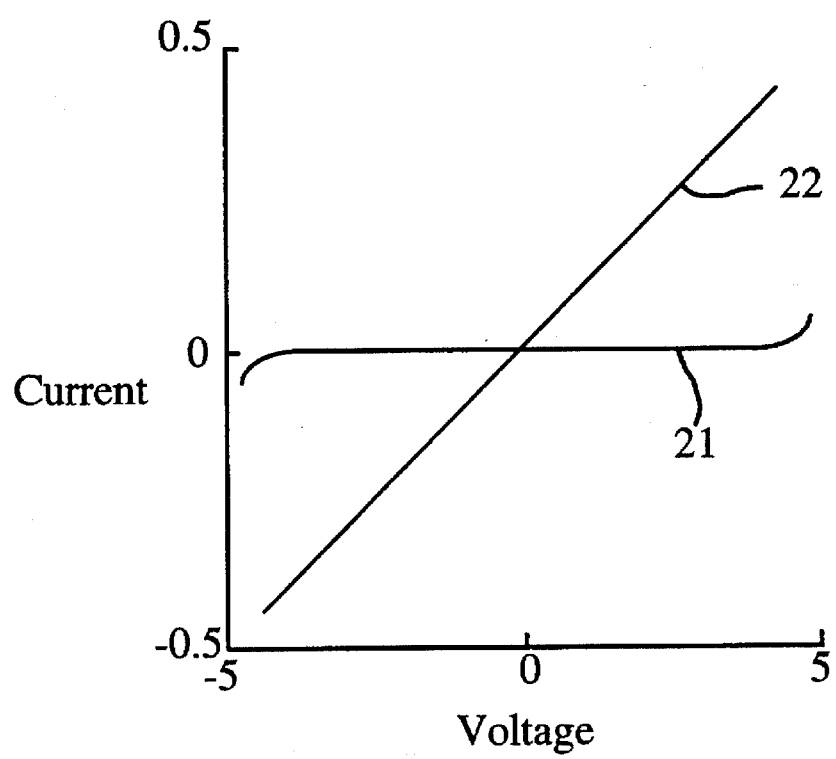
FIG. 2 is a current-voltage characteristic diagram for the electrode of FIG. 1.
Figure 3:
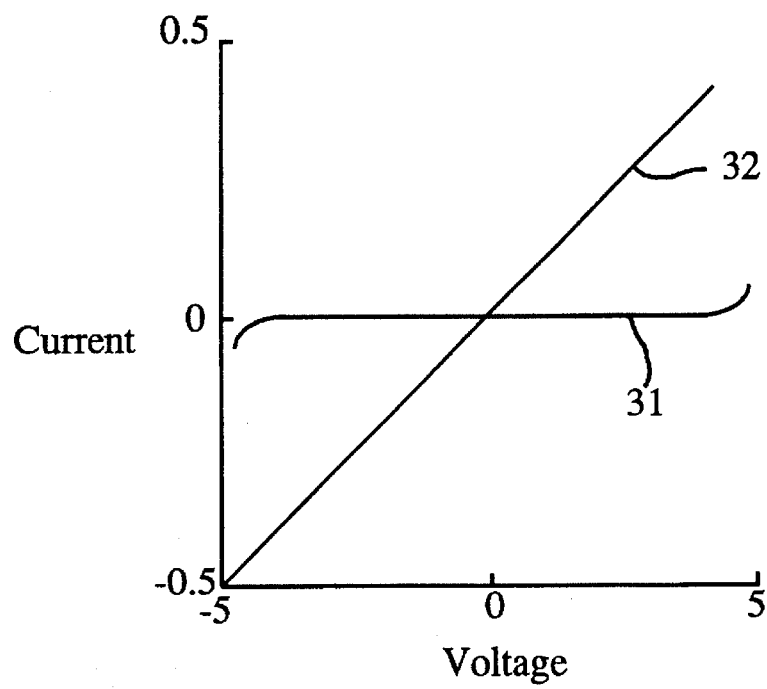
FIG. 3 is a current-voltage characteristic diagram for the Ni layer and SiC layer contact.
Figure 4:
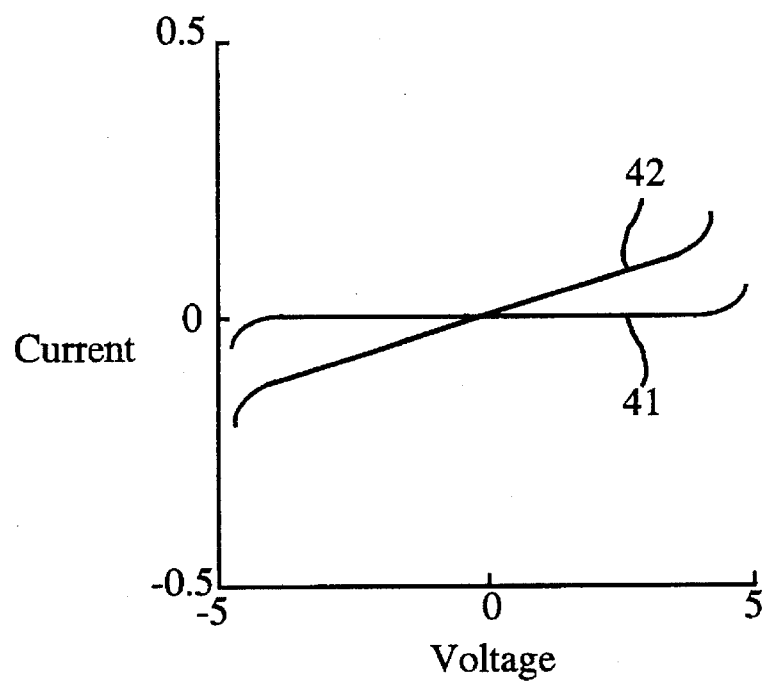
FIG. 4 is a current-voltage characteristic diagram for the W layer and SiC layer contact.

In a first embodiment illustrated in FIG. 1, the electrodes were formed when a W layer 2 of thickness 20 nm was sputter-deposited using the RF magnetron sputtering method on an n-type SiC substrate 1, followed by a sputter-deposited Ni layer 3 of thickness 300 nm, after which it was alloyed in a vacuum for 5 minutes at 1,200° C. When the current-voltage characteristics between electrodes with the same composition formed on the same SiC substrate were measured, rectification characteristics were exhibited, as shown by Line 21 in FIG. 2 prior to alloying, and perfect ohmicity as shown in Line 22 was exhibited after alloying. FIGS. 3 and 4 illustrate the current-voltage characteristics for electrodes formed only of Ni and for electrodes formed only of W.

In the case of the W electrode illustrated in FIG. 4, both Line 41 prior to treatment and Line 42 after alloying exhibit rectification characteristics and do not exhibit perfect ohmicity. Conversely, in the case of the Ni electrode illustrated in FIG. 3, Line 32 after alloying treatment exhibits perfect ohmicity similar to that in FIG. 2. However, when the contact resistance of the Ni/W electrode in the embodiment of the present invention illustrated in FIG. 1 and that of the Ni electrode were measured using the method described on page 69 of Vol. 24, Solid State Electronics (1981), (K. Kuphal), the contact resistance of the Ni-only electrode rose to five times that of the other after being held at 900 C in a vacuum for 48 hours as against equivalent values after alloying, as shown in Table 1.

TABLE 1

| | | Contact resistance (mΩcm$^2$) | |
|---|---|---|---|
| | Electrode composition | After alloying treatment | After being held at 900° C. for 48 hours |
| Embodiment 1 | Ni / W | 1.0 | 1.2 |
| Conventional example | Ni | 1.0 | 5.0 |

Figure 5:
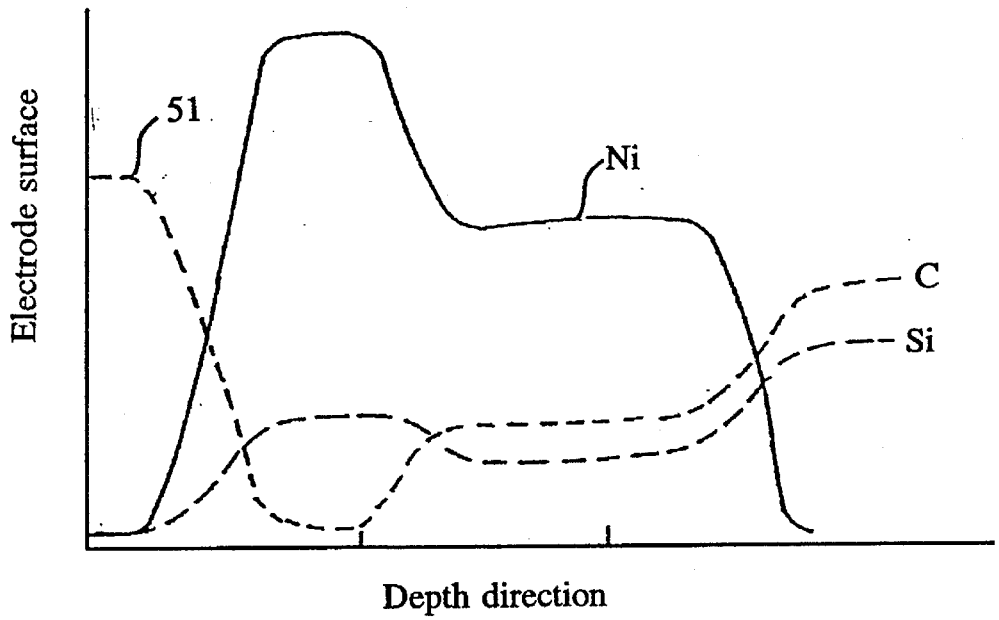
FIG. 5 is a line diagram of the distribution of elemental concentration in the depth direction after alloying a conventional Ni electrode.
Figure 6:
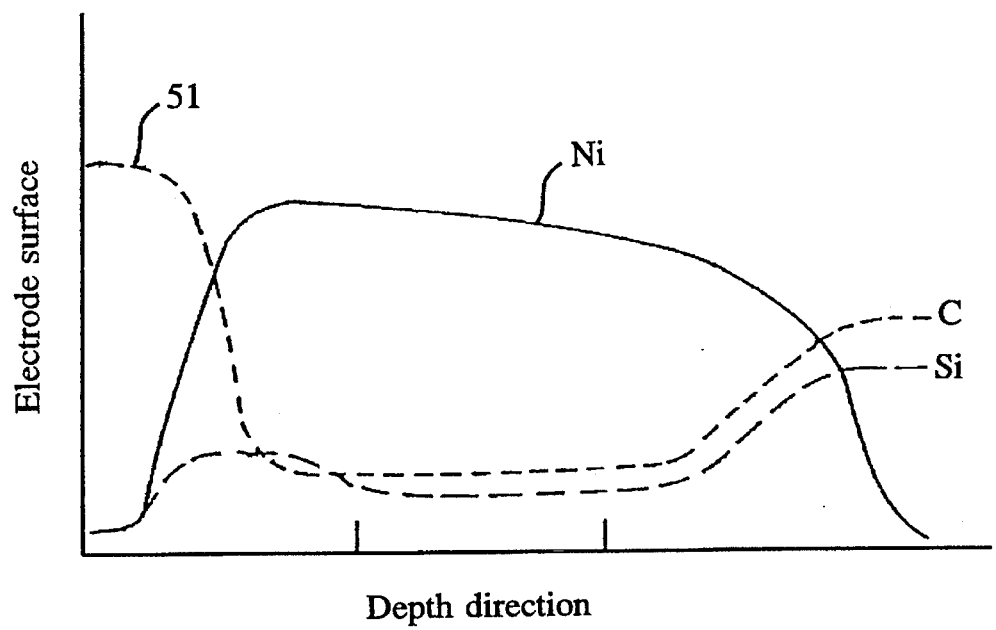
FIG. 6 is a line diagram of the distribution of elemental concentration in the depth direction after holding the electrode in FIG. 5 at high temperature.

The elemental distribution in the depth direction was measured using Auger Electron Spectroscopy (AES). As FIG. 5 shows, it was found that with the conventional electrode in which no W layer 2 is interposed, the Si and C diffuse into the Ni of the Ni electrode when alloy-treated and the Ni reciprocally diffuses into the SiC. In addition, it can be seen as shown by Line 51 that liberated C atoms precipitate on the Ni electrode surface. After being held at 900° C. for 48 hours, diffusion proceeds further with the conventional Ni electrode, as seen in FIG. 6. As described on page 224 of Amorphous and Crystalline Silicon Carbide and Related Materials II (ed. M. M Rahmon et al, published by Springer-Verlag (1989), W reacts with SiC to form silicides and carbides, and this reaction occurs only in the initial stage of the heat treatment. It can be seen that diffusion does not occur even after long periods of high temperature.

Figure 7:
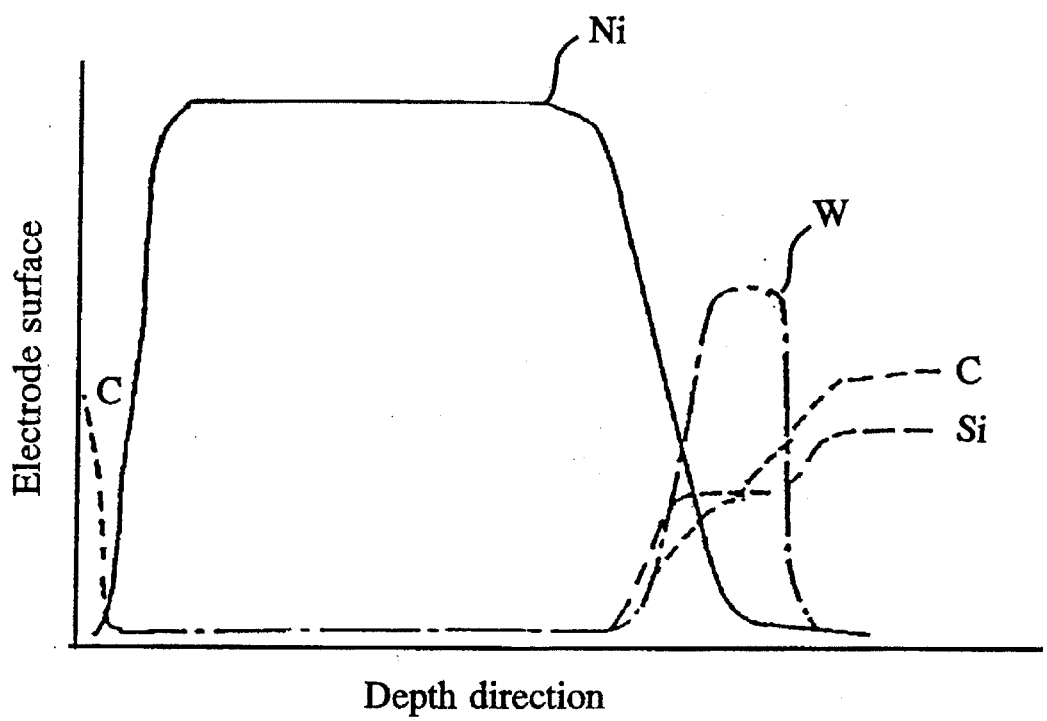
FIG. 7 is a line diagram of the distribution of elemental concentration in the depth direction after alloying the electrode in FIG. 1.
Figure 8:
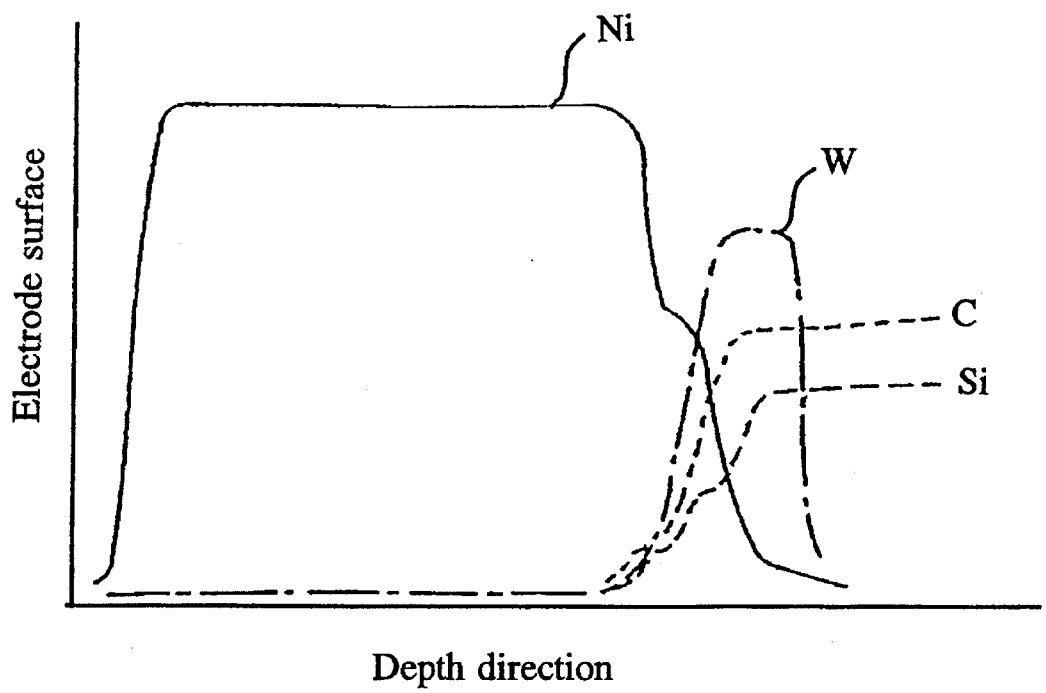
FIG. 8 is a line diagram of the distribution of elemental concentration in the depth direction for the electrode in FIG. 7 after being held at high temperature.

On the other hand, the results of analyzing electrodes of the embodiment of the present invention are shown in FIG. 7 after alloying and in FIG. 8 after being held at 900° C. for 48 hours, with W reacting with SiC, forming silicides and carbides at the interface and preventing the reciprocal diffusion of Ni and SiC. Even when held at high temperature for a long period of time, there was no change in the distribution in the depth direction, and a stable electrode could be provided.

Figure 9:
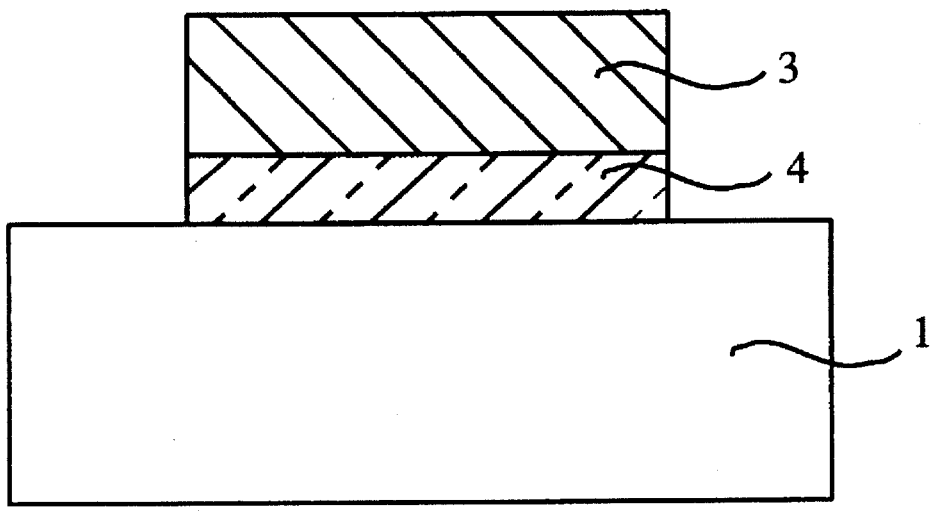
FIG. 9 is a cross-sectional view of the SiC electronic device electrode of the second embodiment of the present invention.

A second embodiment of the invention is shown in FIG. 9, in which W and Si were simultaneously sputter-deposited on n-type SiC 1 using the RF magnetron sputtering method in an atomic ratio of 33:67, obtaining a W-Si alloy layer 4 of thickness 20 nm. Next, a Ni layer 3 of thickness 300 nm was formed by sputter deposition.

The current-voltage characteristics of a specimen of the first embodiment and a specimen of the second embodiment thus obtained were measured. Next, the specimens were alloyed at 500° C. for 20 minutes, and once again the current-voltage characteristics were measured. Next, the alloying temperature was raised in 100° C. increments and the current-voltage characteristics were measured. As a result, both the first and second embodiments exhibited similar current-voltage characteristics of high rectification after sputter deposition. After annealing at 500° C., the current flowed more easily, despite there being some rectification. There was a similar trend for temperatures of 600° C. and 700° C. When alloying treatment at 800° C. was administered, ohmicity was exhibited with the second embodiment. When alloying treatment was administered at 900° C., the contact resistance was 1.1 m Ω cm$^2$, exhibiting contact resistance equivalent to that of the first embodiment which was alloyed at 1,200° C. When a similar experiment was conducted with varying atomic ratios of W and Si, it was found that excellent ohmicity was obtained at low temperatures with a W-Si alloy layer thickness range of 10 nm to 800 nm, where the composition of W was greater than the 25 atomic % and less than 67 atomic %.

Figure 10:
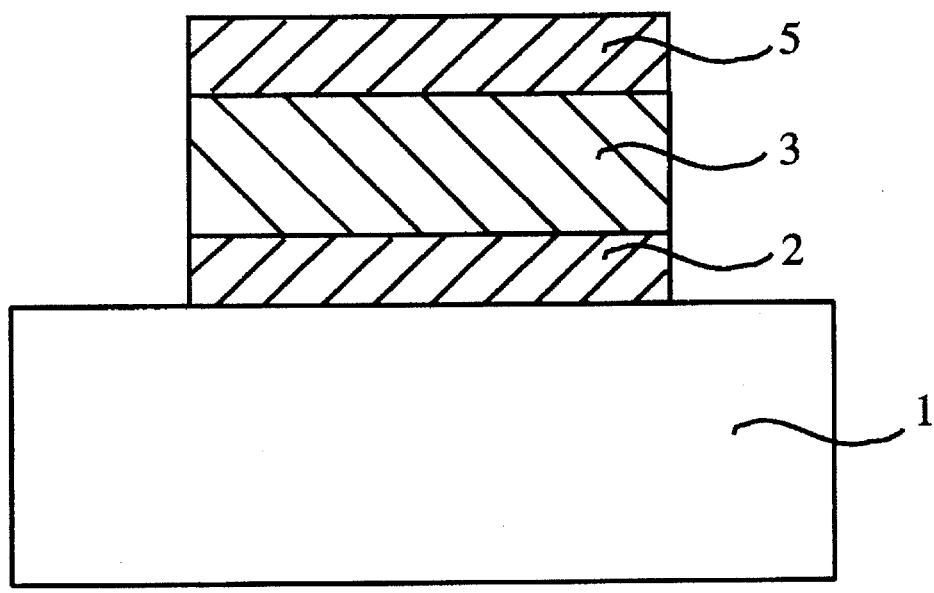
FIG. 10 is a cross-sectional view of the SiC electronic device electrode of the third embodiment of the present invention.

A third embodiment of the invention is shown in FIG. 10, in which Au of thickness 300 run was additionally sputter-deposited on top of the Ni layer 3 of the first embodiment in FIG. 1 forming Au surface layer 5, and similar results were obtained for this electrode. Even with the Au surface layer formed on top of the Ni layer 3 of the second embodiment in FIG. 9, similar results were obtained. With this construction bonding to the electrode is facilitated.

By virtue of the present invention, disposing a W layer between the Ni layer and the SiC base and administering alloying treatment prevented reciprocal diffusion of the Ni with the Si or C, and enabled a SiC electronic device with a stable electrode at high temperatures to be obtained. In addition, replacing this intermediate layer with a W-Si alloy in accordance with the present invention not only displays similar effects, but also provides the advantage that alloying can be carried out at low temperatures.

What is claimed is:

1. A method of manufacturing a silicon carbide electronic device, said method comprising:

forming a tungsten layer on top of an n-type silicon carbide substrate;

forming a conductive metal layer on the tungsten layer, wherein the conductive metal layer includes a nickel layer formed in contact with the tungsten layer; and applying a heat treatment after the conductive metal layer has been formed on the tungsten layer.

2. A method of manufacturing the silicon carbide electronic device as described in claim 1, wherein a temperature of the heat treatment is in a range of 1,100° C. to 1,300° C.

3. A method of manufacturing a silicon carbide electronic device, said method comprising;

forming a tungsten-silicon alloy layer on top of an n-type silicon carbide substrate;

forming a conductive metal layer on the tungsten-silicon alloy layer, wherein the conductive metal layer includes a nickel layer formed in contact with the tungsten-silicon alloy layer; and applying a heat treatment after the conductive metal layer is formed on the tungsten-silicon alloy layer.

4. A method of manufacturing a silicon carbide electronic device described in claim 3, wherein the composition of the tungsten in the tungsten-silicon alloy is in a range of 25 atomic % to 67 atomic %.

5. A method of manufacturing a silicon carbide electronic device described in claim 3, wherein a temperature of the heat treatment is in a range of 800° C. to 1,300° C.

6. A method of manufacturing a silicon carbide electronic device described in claim 4, wherein a temperature of the heat treatment is in a range of 800° C. to 1,300° C.

* * * * *